United States Patent
Lai et al.

(10) Patent No.: US 7,977,181 B2
(45) Date of Patent: Jul. 12, 2011

(54) METHOD FOR GATE HEIGHT CONTROL IN A GATE LAST PROCESS

(75) Inventors: Su-Chen Lai, Hsin-Chu (TW); Kong-Beng Thei, Hsin-Chu County (TW); Harry Chuang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 111 days.

(21) Appl. No.: 12/420,254

(22) Filed: Apr. 8, 2009

(65) Prior Publication Data
US 2010/0087055 A1 Apr. 8, 2010

Related U.S. Application Data

(60) Provisional application No. 61/103,021, filed on Oct. 6, 2008.

(51) Int. Cl.
*H01L 21/8238* (2006.01)
*H01L 21/336* (2006.01)

(52) U.S. Cl. .......... 438/199; 257/E21.635; 257/E21.023

(58) Field of Classification Search ................ 438/585, 438/199; 257/E21.409, E21.635, E21.023, 257/E21.632
See application file for complete search history.

(56) References Cited

U.S. PATENT DOCUMENTS

| | | | |
|---|---|---|---|
| 6,794,281 B2 | 9/2004 | Madhukar et al. | |
| 6,879,009 B2 * | 4/2005 | Zheng et al. | 257/407 |
| 7,005,365 B2 | 2/2006 | Chambers | |
| 7,056,782 B2 | 6/2006 | Amos et al. | |
| 7,138,323 B2 | 11/2006 | Kavalieros et al. | |
| 7,718,479 B2 * | 5/2010 | Kavalieros et al. | 438/184 |
| 2005/0287746 A1 | 12/2005 | Metz et al. | |
| 2006/0246740 A1 * | 11/2006 | Cartier et al. | 438/778 |
| 2007/0013070 A1 * | 1/2007 | Liang et al. | 257/758 |

* cited by examiner

*Primary Examiner* — Matthew Smith
*Assistant Examiner* — Christine Enad
(74) *Attorney, Agent, or Firm* — Haynes and Boone, LLP

(57) ABSTRACT

Provided is a method that includes forming first and second gate structures in first and second regions, respectively, the first gate structure including a first hard mask layer having a first thickness and the second gate structure including a second hard mask layer having a second thickness less than the first thickness, removing the second hard mask layer from the second gate structure, forming an inter-layer dielectric (ILD) over the first and second gate structures, performing a first chemical mechanical polishing (CMP), remove the silicon layer from the second gate structure thereby forming a first trench, forming a first metal layer to fill the first trench, performing a second CMP, remove the remaining portion of the first hard mask layer and the silicon layer from the first gate structure thereby forming a second trench, forming a second metal layer to fill the second trench, and performing a third CMP.

20 Claims, 12 Drawing Sheets

METHOD FOR GATE HEIGHT CONTROL IN A GATE LAST PROCESS

PRIORITY DATA

This application claims priority to Provisional Application Ser. No. 61/103,021 filed on Oct. 6, 2008, entitled "Method for Gate Height Control in a Gate Last Process," the entire disclosure of which is incorporated herein by reference.

BACKGROUND

As technology nodes shrink, in some IC designs, there has been a desire to replace the typically polysilicon gate electrode with a metal gate electrode to improve device performance with the decreased feature sizes. Providing metal gate structures (e.g., including a metal gate electrode rather than polysilicon) offers one solution. One process of forming a metal gate stack is termed "gate last" process in which the final gate stack is fabricated "last" which allows for reduced number of subsequent processes, including high temperature processing, that must be performed after formation of the gate. Additionally, as the dimensions of transistors decrease, the thickness of the gate oxide must be reduced to maintain performance with the decreased gate length. In order to reduce gate leakage, high dielectric constant (high-k) gate insulator layers are also used which allow greater physical thicknesses while maintaining the same effective thickness as would be provided by a typical gate oxide used in larger technology nodes. There are challenges to implementing such features and processes in CMOS fabrication however. For example, in a "gate last" fabrication process, problems have arisen with control of the gate height due to factors such as a loading effect of nMOS and pMOS devices and non-uniformity of a chemical mechanical polishing (CMP) process.

SUMMARY

One of the broader forms of an embodiment of the invention involves a method for fabricating a semiconductor device. The method includes providing a semiconductor substrate having a first region and a second region; forming a first gate structure in the first region and a second gate structure in the second region, the first gate structure including a first hard mask layer that has a first thickness and the second gate structure including a second hard mask layer that has a second thickness less than the first thickness; removing the second hard mask layer from the second gate structure, wherein a portion of the first hard mask layer remains in the first gate structure; forming an inter-layer dielectric (ILD); performing a first chemical mechanical polishing (CMP) to expose a silicon layer in the second gate structure; remove the silicon layer from the second gate structure thereby forming a first trench, wherein the remaining portion of the first hard mask layer protects a silicon layer in the first gate structure from being removed; forming a first metal layer to fill the first trench; performing a second CMP to expose the remaining portion of the first hard mask layer in the first gate structure; remove the remaining portion of the first hard mask layer and the silicon layer from the first gate structure thereby forming a second trench; forming a second metal layer to fill the second trench; and performing a third CMP to planarize the semiconductor device.

Another one of the broader forms of an embodiment of the invention involves a method for fabricating a semiconductor device. The method includes providing a semiconductor substrate having a first region and a second region; forming first and second gate structures over the first and second regions, respectively, the first gate structure including a first hard mask layer having a first thickness and a first dummy poly, the second gate structure including a second hard mask layer having a second thickness less than the first thickness and a second dummy poly; removing the second hard mask layer from the second gate structure and a portion of the first hard mask layer from the first gate structure; forming an inter-layer dielectric (ILD); performing a first chemical mechanical polishing (CMP) to expose the second dummy poly; remove the second dummy poly from the second gate structure thereby forming a first trench; forming a first metal layer to fill the first trench; performing a second CMP on the first metal layer to expose a remaining portion of the first hard mask layer in the first gate structure; remove the remaining portion of the first hard mask layer and the first dummy poly from the first gate structure thereby forming a second trench; forming a second metal layer to fill the second trench; and performing a third CMP to planarize the semiconductor device.

Yet another one of the broader forms of an embodiment of the invention involves a method for fabricating a semiconductor device. The method includes providing a semiconductor substrate having a first region and a second region; forming a high-k dielectric layer over the semiconductor substrate; forming a polysilicon layer over the high-k dielectric layer; partially etching the polysilicon layer; forming a hard mask layer over the partially etched polysilicon layer, the hard mask layer overlying the first region having a first thickness and the hard mask layer overlying the second region having a second thickness less than the first thickness; patterning the high-k dielectric layer, the partially etched polysilicon layer, and the hard mask layer to form first and second gate structures over the first region and second region, respectively; removing the hard mask layer from the second gate structure and a portion of the hard mask layer from the first gate structure; forming an inter-layer dielectric (ILD); performing a first chemical mechanical polishing (CMP) to expose the polysilicon layer in the second gate structure; remove the polysilicon layer from the second gate structure thereby forming a first trench; forming a first metal layer to fill the first trench; performing a second CMP to expose a remaining portion of the hard mask layer in the first gate structure; remove the remaining portion of the hard mask layer and the polysilicon layer from the first gate structure thereby forming a second trench; forming a second metal layer to fill the second trench; and performing a third CMP to planarize the semiconductor device.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
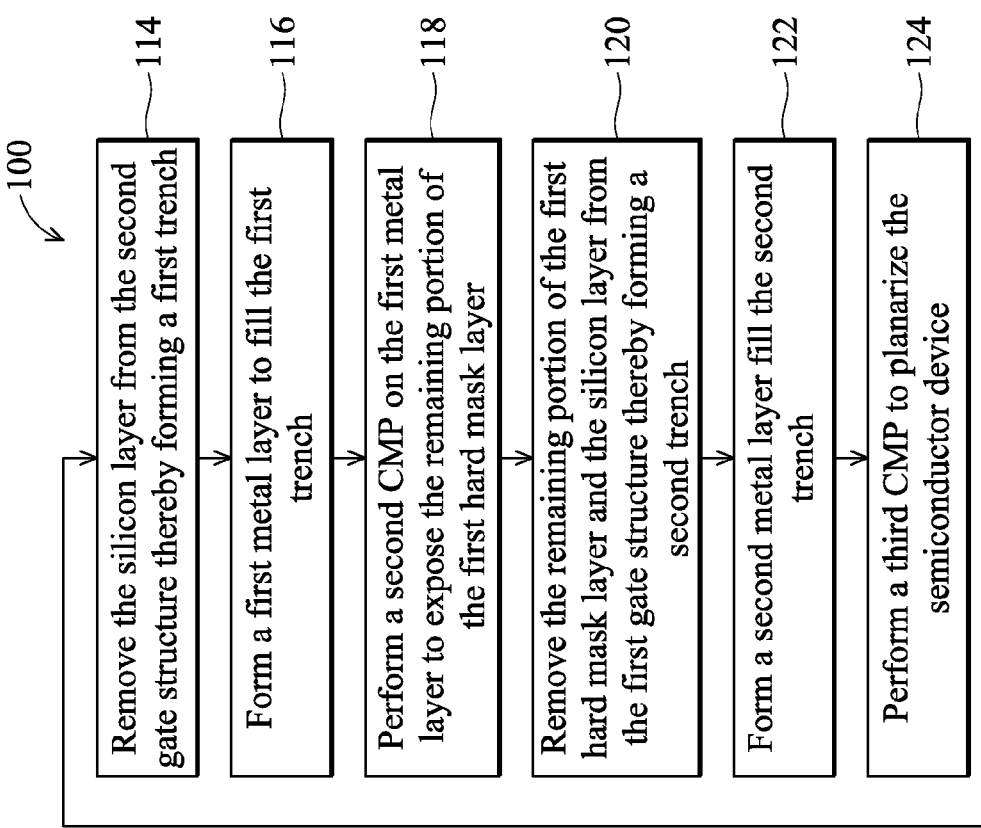
FIG. 1 is a flowchart of a method for fabricating a semiconductor device in a gate last process according to various aspects of the present disclosure.

The present disclosure relates generally to forming an integrated circuit device on a substrate and, more particularly, to fabricating a gate structure as part of an integrated circuit (including FET devices). It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. In addition, the present disclosure provides examples of a "gate last" metal gate process, however one skilled in the art may recognize applicability to other processes and/or use of other materials.

Referring to FIG. 1, illustrated is a flowchart of a method 100 for fabricating a semiconductor device in a "gate last" process. Referring also to FIGS. 2A to 2K illustrated are cross-sectional views of a semiconductor device 200 at various stages of fabrication according to the method 100 of FIG. 1. The semiconductor device 200 may be an integrated circuit, or portion thereof, that may comprise static random access memory (SRAM) and/or other logic circuits, passive components such as resistors, capacitors, and inductors, and active components such as P-channel field effect transistors (pFET), N-channel FET (nFET), metal-oxide semiconductor field effect transistors (MOSFET), or complementary metal-oxide semiconductor (CMOS) transistors. It should be noted that some features of the semiconductor device 200 may be fabricated with a CMOS process flow. Accordingly, it is understood that additional processes may be provided before, during, and after the method 100 of FIG. 1, and that some other processes may only be briefly described herein.

Figure 2A:
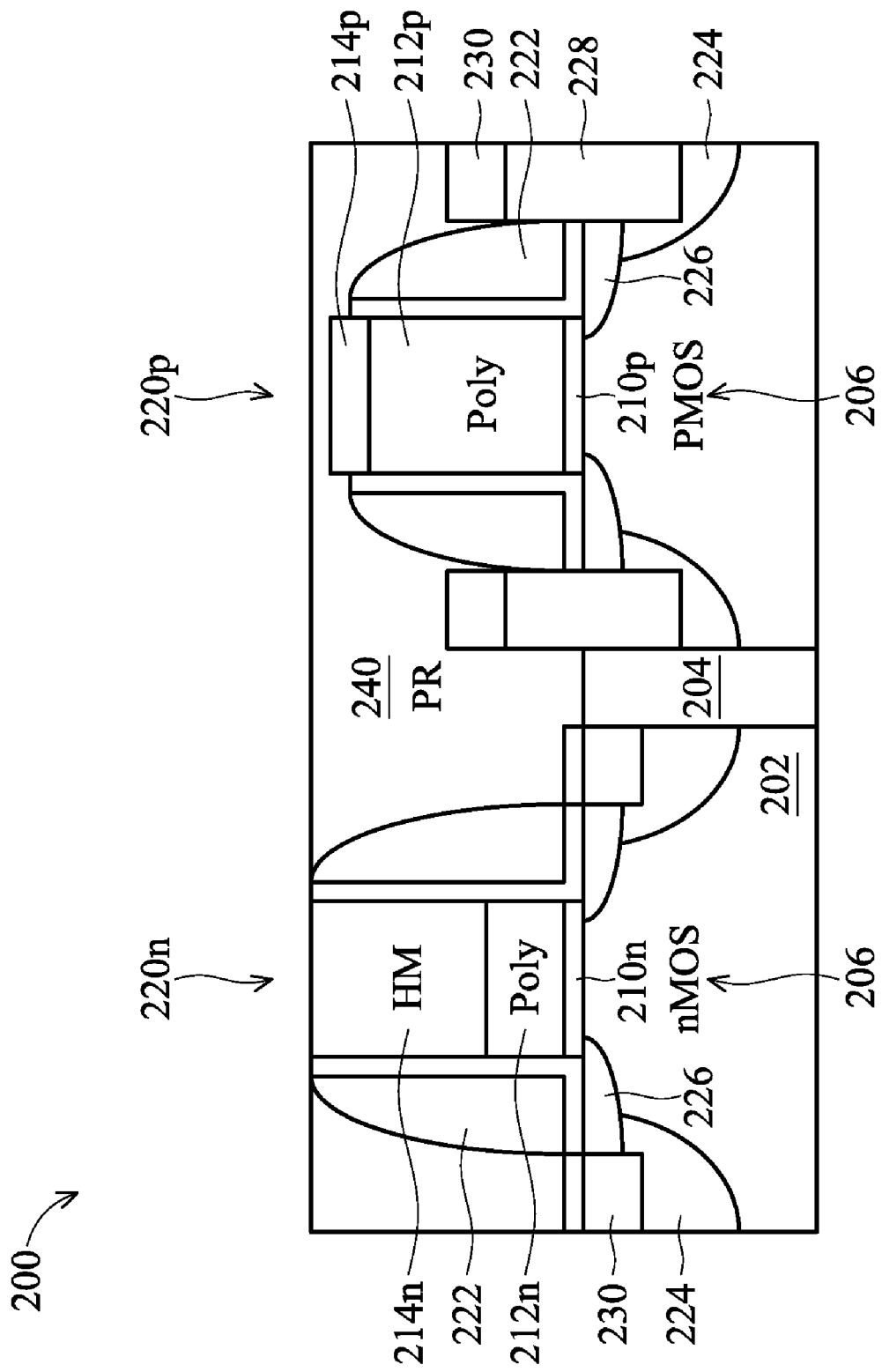
FIGS. 2A to 2K are cross-sectional views of a semiconductor device at various stages of fabrication in a gate last process according to the method of FIG. 1.

The method 100 begins with block 102 in which a semiconductor substrate is provided, the substrate having a first region and a second region. In FIG. 2A, the semiconductor device 200 may include a substrate 202. In the present embodiment, the substrate 202 includes a silicon substrate (e.g., wafer) in crystalline structure. The substrate 202 may include various doping configurations depending on design requirements as is known in the art (e.g., p-type substrate or n-type substrate) Additionally, the substrate 202 may include various doped regions such as p-type wells (p-wells) or n-type wells (n-wells). Other examples of the substrate 202 may also include other elementary semiconductors such as germanium and diamond. Alternatively, the substrate 202 may include a compound semiconductor such as, silicon carbide, gallium arsenide, indium arsenide, or indium phosphide. Further, the substrate 202 may optionally include an epitaxial layer (epi layer), may be strained for performance enhancement, and/or may include a silicon-on-insulator (SOI) structure.

The semiconductor device 200 includes isolation structures such as shallow trench isolation (STI) 204 features formed in the substrate 202 to isolate one or more devices from each other. In the present embodiment, the STI feature 204 isolates an nMOS device 206 and a pMOS device 208. The STI features may include silicon oxide, silicon nitride, silicon oxynitride, fluoride-doped silicate glass (FSG), and/or a low k dielectric material. Other isolation methods and/or features are possible in lieu of or in addition to STI. The STI features may be formed using processes such as reactive ion etch (RIE) of the substrate 202 to form trenches which are then filled with an insulator material using deposition processes followed by a CMP process.

The method 100 continues with block 104 in which a first gate structure is formed in the first region and a second gate structure is formed in the second region, the first gate structure including a first hard mask layer that has a first thickness and the second gate structure including a second hard mask layer that has a second thickness less than the first thickness. The formation of the gate structure includes forming various material layers, partially etching some material layers, and patterning the various material layers to form a gate structure of the nMOS device 206 and a gate structure of the pMOS device 208 as discussed below.

The semiconductor device 200 includes a gate dielectric 210 formed over the substrate. The gate dielectric 210 includes an interfacial layer. The interfacial layer may include a silicon oxide layer (e.g., thermal or chemical oxide formation) having a thickness ranging from about 5 to about 10 angstrom (A). The gate dielectric 210 further includes a dielectric constant (high-k) material layer formed on the interfacial layer. In an embodiment, the high-k dielectric material includes hafnium oxide ($HfO_2$). Other examples of high-k dielectrics include hafnium silicon oxide (HfSiO), hafnium silicon oxynitride (HfSiON), hafnium tantalum oxide (HfTaO), hafnium titanium oxide (HfTiO), hafnium zirconium oxide (HfZrO), combinations thereof, and/or other suitable materials. The high-k dielectric layer may be formed by atomic layer deposition (ALD) or other suitable technique. The high-k dielectric layer includes a thickness ranging from about 10 to about 30 angstrom (A). In some embodiments, a barrier layer may be formed over the high-k dielectric layer. The barrier layer may include TiN or TaN having a thickness ranging from abut 10 to about 20 angstrom (A). The barrier layer may be formed by various deposition techniques such as ALD, physical vapor deposition (PVD or sputtering), chemical vapor deposition (CVD), or other suitable process.

The semiconductor device 200 further includes a polysilicon (or poly) layer 212 formed over the gate dielectric 210 by CVD or other suitable deposition process. The poly layer 212 may include a thickness ranging from about 400 to about 800 angstrom (A). Prior to gate patterning, the poly layer 212 is partially etched in a region where one type of device (e.g., nMOS device 206 or pMOS 208) is to be formed. In the present embodiment, a portion of the poly layer 212 in the region of the nMOS device 206 is etched by a wet or dry etch process.

For example, a patterned photoresist layer is formed to protect the poly layer 212 in the pMOS device 208 side. The patterned photoresist layer may be formed by photolithography, immersion lithography, ion-beam writing, or other suitable patterning process. The unprotected poly layer 212 in the nMOS device 206 side is partially etched by a wet etch process that includes exposure to a hydroxide containing solution (e.g., ammonium hydroxide), deionized water, and/or other suitable etchant solutions. The desired thickness of the poly layer 212 in the nMOS device 206 side may be achieved by precisely controlling the etching time of the wet etch process. In the present embodiment, the thickness of the poly layer 212 in the nMOS device 206 side may range from 200 to about 600 angstrom (A). The patterned photoresist layer may then be removed by stripping or ashing process.

A hard mask layer 214 is formed over the partially etched poly layer 212. The hard mask layer 214 may include silicon oxide, silicon nitride, silicon oxynitride, and/or other suitable materials. The hard mask layer 214 may be formed using methods such as CVD, PVD, or ALD. Additionally, an anti-reflective coating (ARC) layer or bottom anti-reflective coating (BARC) layer may be formed on the hard mask layer 214 to enhance a subsequent patterning process as is known in the art. A patterned photoresist layer may be formed on the hard mask layer 214. The patterned photoresist layer may include a gate pattern for the nMOS device 206 side and a gate pattern for the pMOS device 208 sdie. The gate patterns may be formed by photolithography, immersion lithography, ion-beam writing, or other suitable process.

The hard mask layer 214 may be patterned by a dry or wet etching process using the patterned photoresist as a mask, and the patterned hard mask layer may be used to pattern a gate structure 220n for the nMOS device 206 and a gate structure 220p for the pMOS device 208. The gate structures 220n, 220p may be formed by a dry or wet or combination dry an wet etching process (e.g., gate etching or patterning). For example, the dry etching process may use a fluorine-containing plasma (e.g., etch gas includes $CF_4$). Alternatively, the etching process may include multiple etching steps to etch the various gate material layers. The patterned photoresist layer is removed by a stripping or ashing process.

The gate structure 220n of the nMOS device 206 includes a hard mask layer 214n, a dummy poly layer 212n, and a gate dielectric layer 210n (including an interfacial layer and high-k dielectric layer). The gate structure 220p of the pMOS device 208 included a hard mask layer 214p, a dummy poly layer 212p, and a gate dielectric layer 210p (including an interfacial layer and high-k dielectric layer). It should be noted that the thickness of the hard mask layer 214n in the nMOS device 206 side is larger than the thickness of the hard mask layer 214p in the pMOS device 208 side since the dummy poly layer 214n is partially recessed in the gate structure 220n as compared to the dummy poly layer 214p in the gate structure 220p.

After gate patterning, it is understood that the semiconductor device 200 undergoes further processing in a CMOS process flow to form various features as is known in the art. For example, gate or sidewall spacers 222 are formed on both sidewalls of the gate structures 220n, 220p. The spacers 222 may be formed of silicon oxide, silicon nitride, silicon oxynitride, silicon carbide, fluoride-doped silicate glass (FSG), a low k dielectric material, combinations thereof, and/or other suitable material. The spacers 222 may have a multiple layer structure, for example, including one or more liner layers. The liner layer may include a dielectric material such as silicon oxide, silicon nitride, and/or other suitable materials. The spacers 222 may be formed by methods including deposition of suitable dielectric material and anisotropically etching the material to form the spacer 222 profile.

Also, source/drain (S/D) regions 224 are formed in the substrate 202. The S/D regions 224 include lightly doped source/drain regions (LDD) shown as regions 228 and heavy doped source/drain regions. It should be noted that the LDD regions 228 may be formed prior to formation of the spacers 222. The S/D regions 224 may be formed by implanting p-type or n-type dopants or impurities into the substrate 202 depending on the desired transistor configuration (e.g., nMOS or pMOS). The S/D regions 224 may be formed by methods including photolithography, ion implantation, diffusion, and/or other suitable processes. Additionally, the S/D regions 224 of the pMOS device 208 may include raised S/D regions with SiGe features 228. For example, the SiGe features 228 may be formed by an epitaxy process such that the SiGe features can be formed in a crystalline state in the substrate 202. Thus, a strained channel may be achieved in the pMOS device 208 to increase carrier mobility and enhance device performance.

Further, contact features 230 such as silicide are formed and coupled to the S/D regions 224. The contact features 230 may be formed on the S/D regions 224 by a salicide (self-aligned silicide) process. For example, a metal material may formed next to silicon structures, then the temperature is raised to anneal and cause a reaction between the underlying silicon and metal material to form silicide, and the un-reacted metal may be etched away. The contacts 230 may include nickel silicide, cobalt silicide, tungsten silicide, tantalum silicide, titanium silicide, platinum silicide, erbium silicide, palladium silicide, or combinations thereof. It should be noted that the hard mask layers 214n, 214p protect the dummy poly layers 212n, 212p from the salicide process.

Figure 2B:
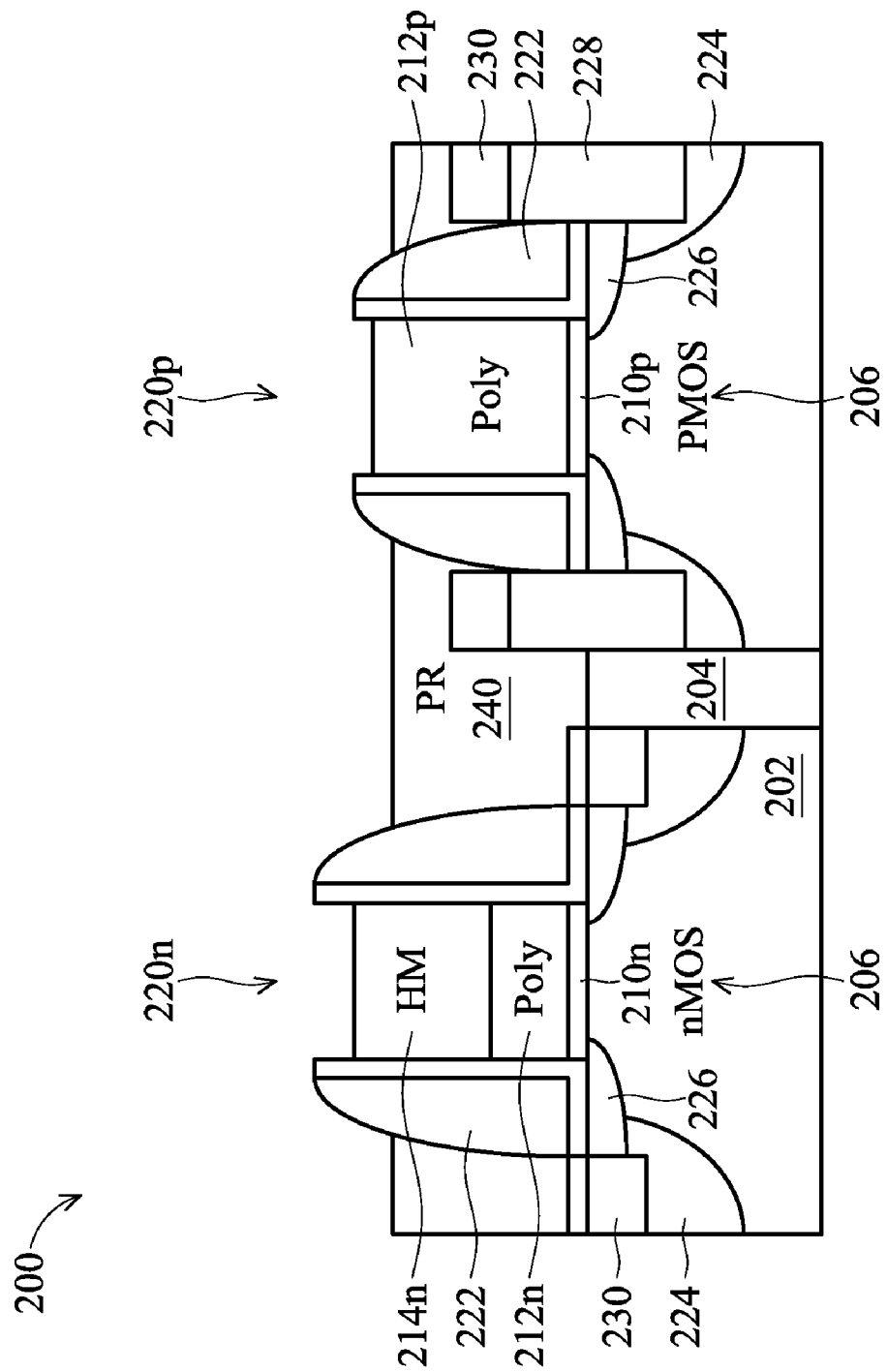

The method 100 continues with block 106 in which the second hard mask layer is removed from the second gate structure. The hard mask layer 214p in the gate structure 220p may be removed by an etch back process or other suitable process. A photoresist (PR) layer 240 may be formed over the substrate 202 by a spin-coating process. Further, a soft-bake process may be performed on the photoresist layer 240 to evaporate the solvent from the photoresist layer. In FIG. 2B, an etch back process removes a portion of the photoresist layer 240 and the process may stop at the dummy poly layer 212p in the gate structure 220p. It should be noted that the photoresist layer 240 is not patterned by exposure but used for the etch back process. Accordingly, the etch back process removes the entire hard mask layer 214p in the gate structure 220p but only removes a portion of the hard mask layer 214n in the gate structure 220n. After the etch back process, the hard mask layer 214n may include a thickness ranging from 200 to about 600 angstrom (A). The thickness of the hard mask layer 214n may be tunable to control the gate height of the film stack during a subsequent gate last process flow as will be explained below. The photoresist layer 240 may be removed by stripping or other suitable process.

Figure 2C:
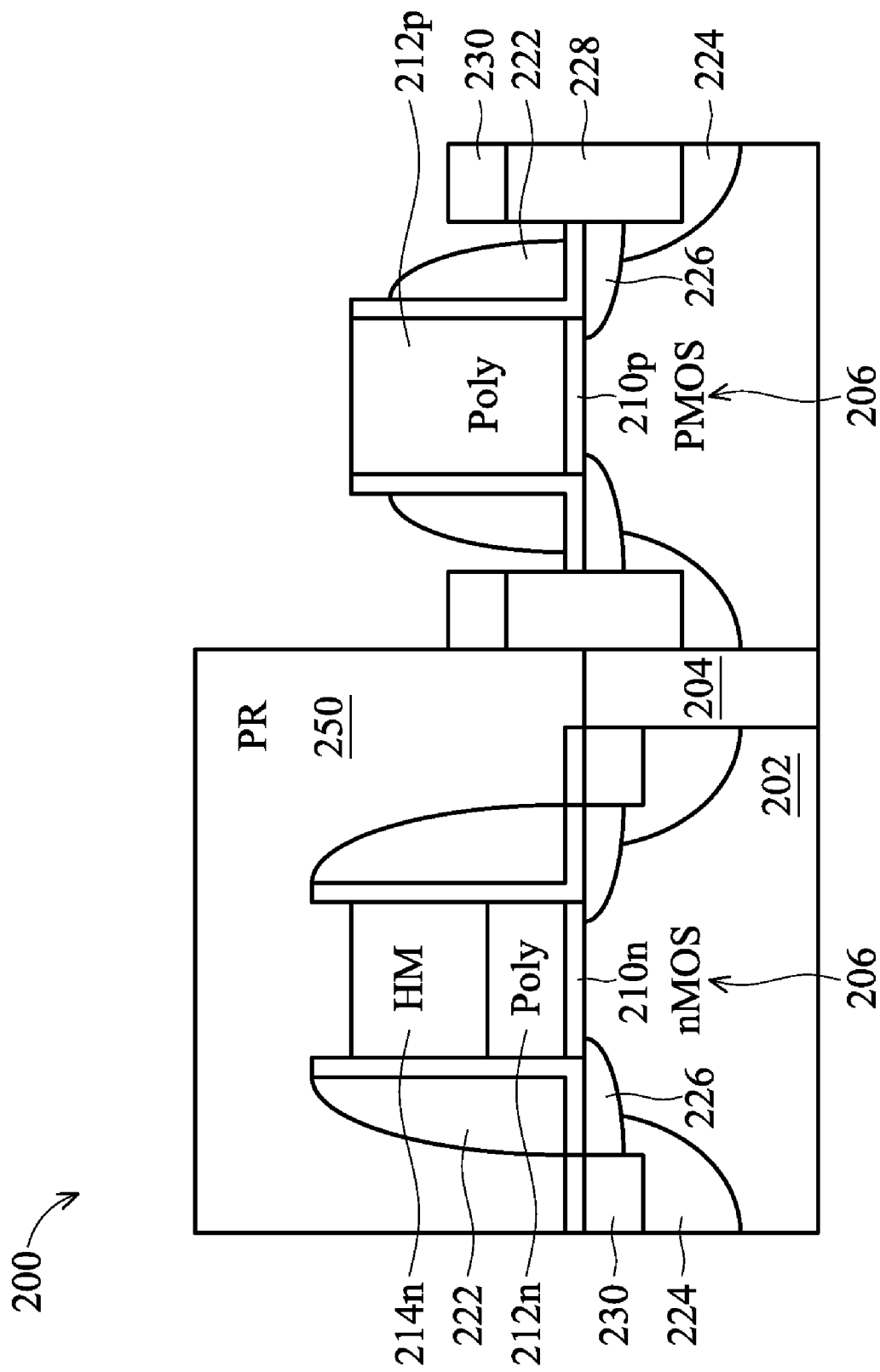

In FIG. 2C, the spacers 222 formed on the gate structure 220p in the pMOS device 208 may be adjusted by a dry or wet etch process. A patterned photoresist layer 250 may be formed to protect the nMOS device 206 side. The patterned photoresist layer 250 may be formed by photolithography, immersion lithography, ion-beam writing, or other suitable process. For example, the photolithography process may include spin coating, soft-baking, exposure, post-baking, developing, rinsing, drying, and other suitable process. The spacers 222 may be adjusted or trimmed to achieve a desired height for the gate structure 220p. The dummy poly layer 212p may be partially etched by a dry or wet etch process such that a top surface of the dummy poly layer 212p may also be at the desired gate stack height for the gate structure 220p.

Figure 2D:
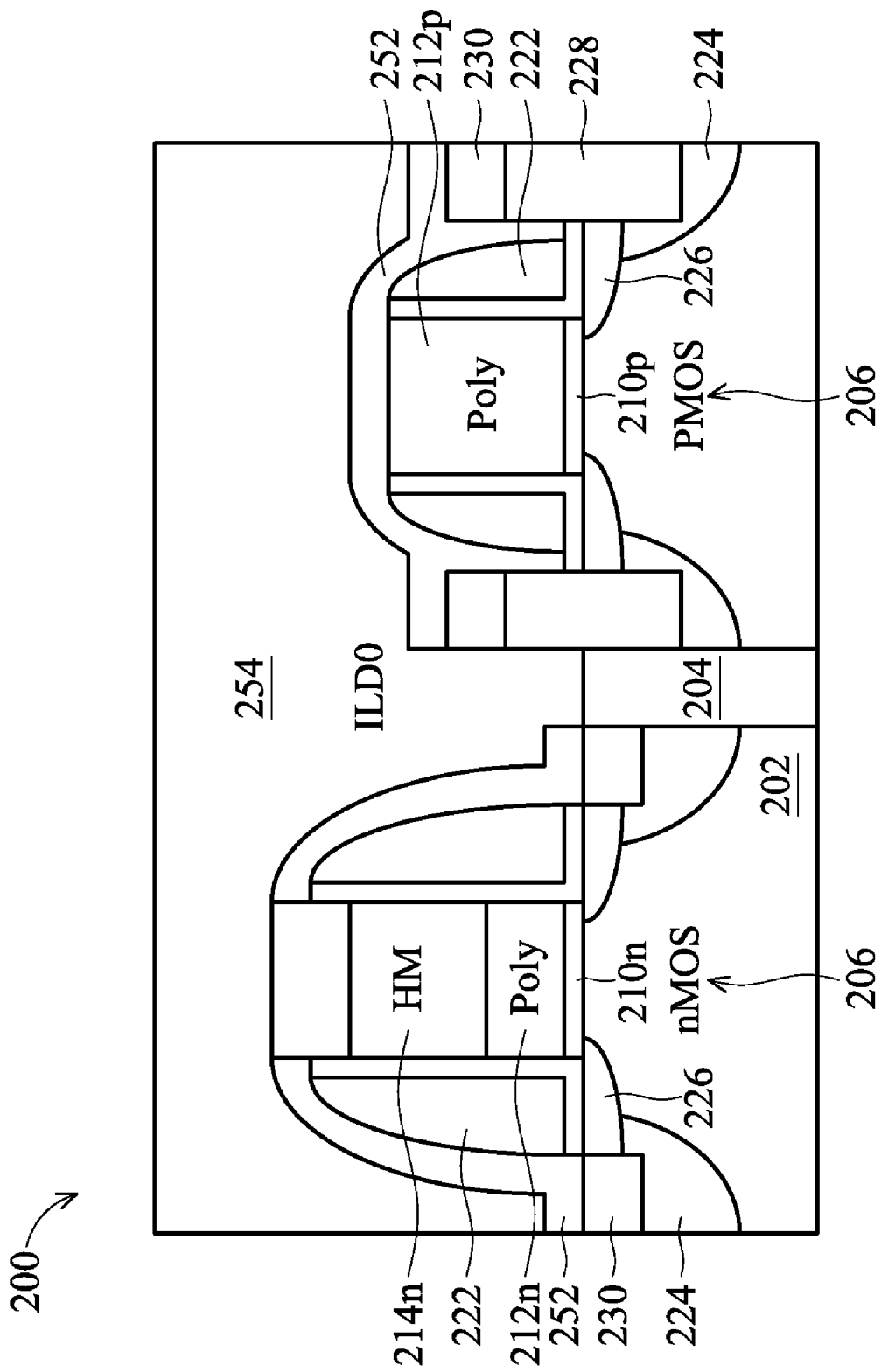

The method 100 continues with block 108 in which a contact etch stop layer (CESL) is formed over the first and second gate structures. In FIG. 2D, a contact etch stop layer (CESL) 252 may be formed over the various structures of the semiconductor device 200. The CESL 252 may be formed of silicon nitride, silicon oxynitride, and/or other suitable materials. The CESL 252 composition is selected based upon etching selectivity to one or more additional features of the semiconductor device 200. The method 100 continues with block 110 in which an inter-layer dielectric (ILD) is formed over the CESL. The semiconductor device 200 further includes a dielectric layer 254 such as an inter-layer (or level) dielectric (ILD) layer formed over the CESL 252 by CVD, high density plasma (HDP) CVD, spin-on, sputtering, or other suitable methods. The dielectric layer 254 may include silicon oxide, silicon oxynitride, or a low-k material.

Figure 2E:
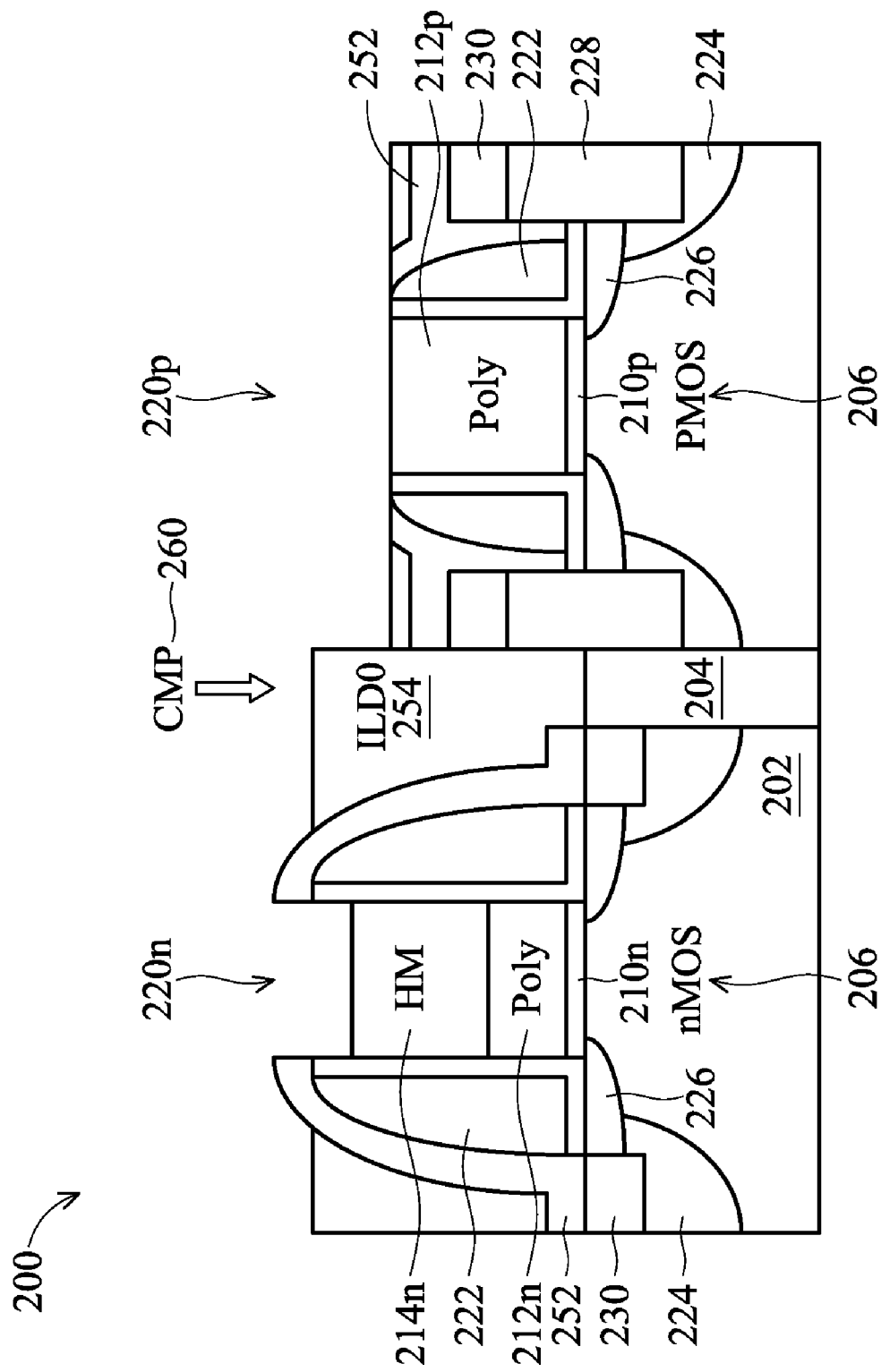

The method 100 continues with block in 112 which a first chemical mechanical polishing (CMP) process is performed on the ILD to expose the silicon layer in the second gate structure. In FIG. 2E, in a gate last process, the dummy poly layers 212n, 212p are removed so that a true metal gate structure may be formed in place of the dummy poly layer. Accordingly, the dielectric layer 254 is planarized by a chemical mechanical polishing (CMP) process 260 until a top portion of the dummy ploy layer 212p in the gate structure 220p is reached or exposed. In the present embodiment, the dummy poly layer 212p of the gate structure 220p will be exposed first since the hard mask layer 214p was already removed by the etch back process. Thus, the CESL 252 may function as a stop layer and an overpolishing may be performed to expose the dummy poly layer 212p. It should be noted that the hard mask layer 214n in the gate structure 220n is still present to protect the dummy poly layer 212n of the nMOS device 206 side during removal of the dummy poly layer 212p discussed below. Also, the hard mask layer 214n may enhance the control of the gate height (e.g., N/P loading effect) with respect to the CMP process 260.

Figure 2F:
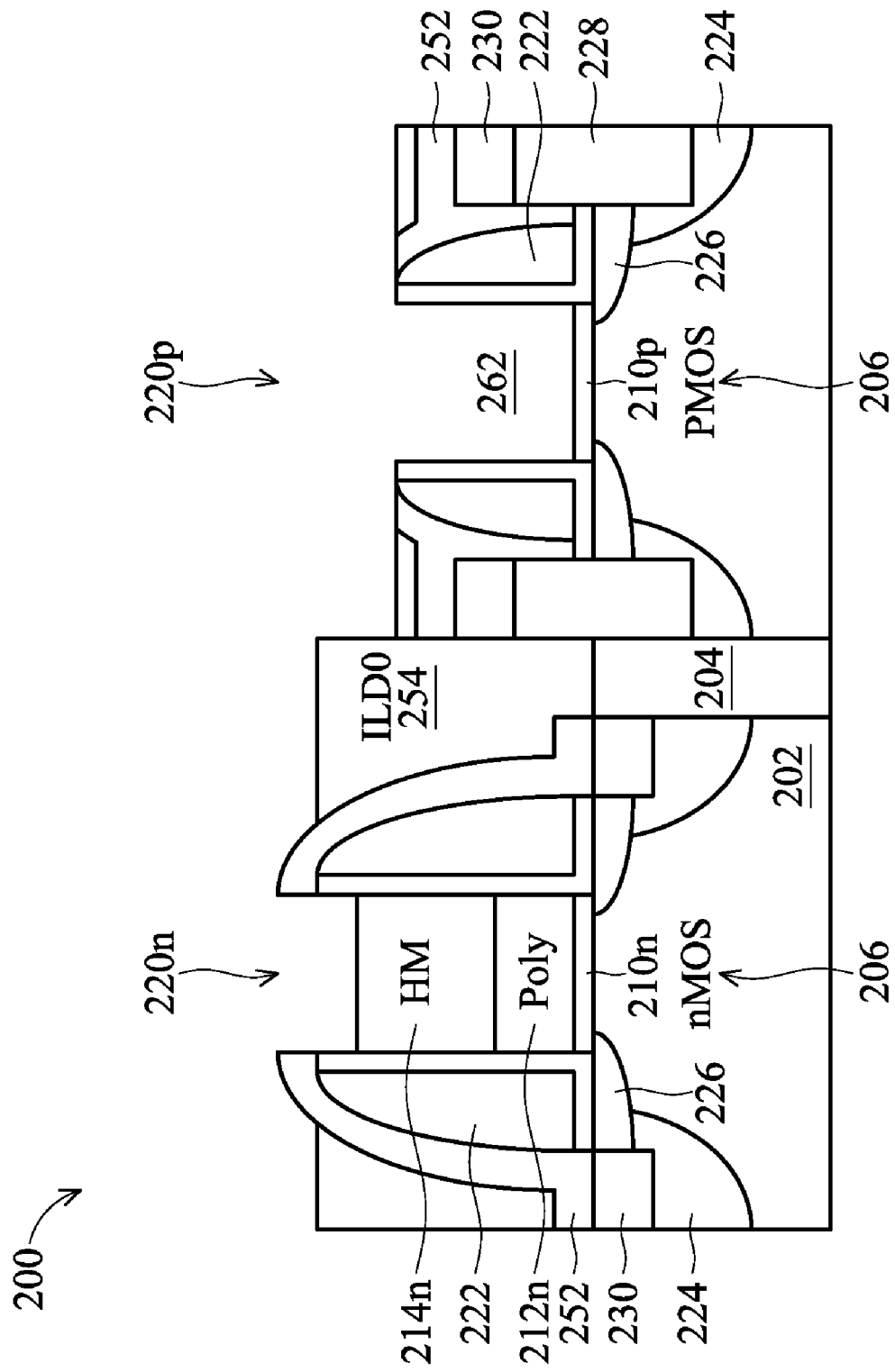

The method 100 continues with block 114 in which the silicon layer is removed from the second gate stack thereby forming a first trench. In FIG. 2F, following the CMP process 260, the dummy poly layer 212p in the gate structure 220p is removed. For example, polysilicon is selectively etched removing the dummy poly layer 212p from the gate structure 220p. The selective removal of the dummy gate structure 212p provides a trench 262 within which a metal gate may be formed. The dummy poly layer 212p may be removed using a wet etch and/or a dry etch. In an embodiment, a wet etch process includes exposure to a hydroxide containing solution (e.g., ammonium hydroxide), deionized water, and/or other suitable etchant solutions.

Figure 2G:
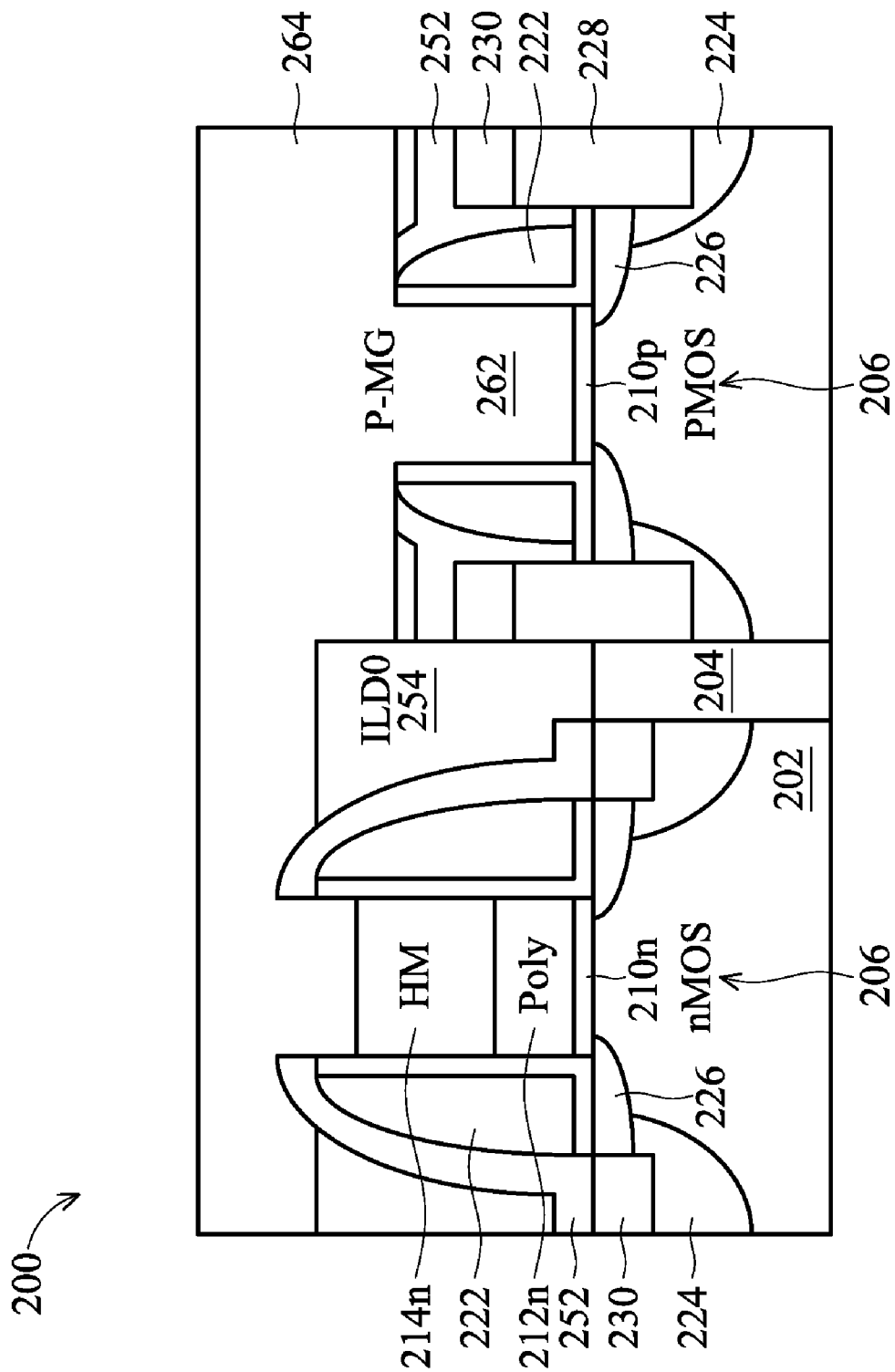

The method 100 continues with block 116 in which a first metal layer is formed to fill the first trench. In FIG. 2G, a metal layer 264 is deposited to fill in the trench 262. The metal layer 264 includes any metal material suitable for forming a metal gate or portion thereof, including work function layers, liner layers, interface layers, seed layers, adhesion layers, barrier layers, etc. The metal layer 264 may be formed by PVD or other suitable processes. The metal layer 264 may include a P-type work function metal (P-metal) that provides a gate electrode that properly performs in the pMOS device 208. P-metal materials include TiN, WN, TaN, conductive metal oxides, and/or other suitable materials. The metal layer 264 may further include a fill metal layer formed on the work function metal layer. The fill metal layer may include aluminum (Al) or tungsten (W), or other suitable materials. In an embodiment, the fill metal may include a Ti layer that functions as a wetting layer and an Al layer to fill in the remainder of the trench. The fill metal layer may be deposited using CVD, PVD, plating, or other suitable process.

Figure 2H:
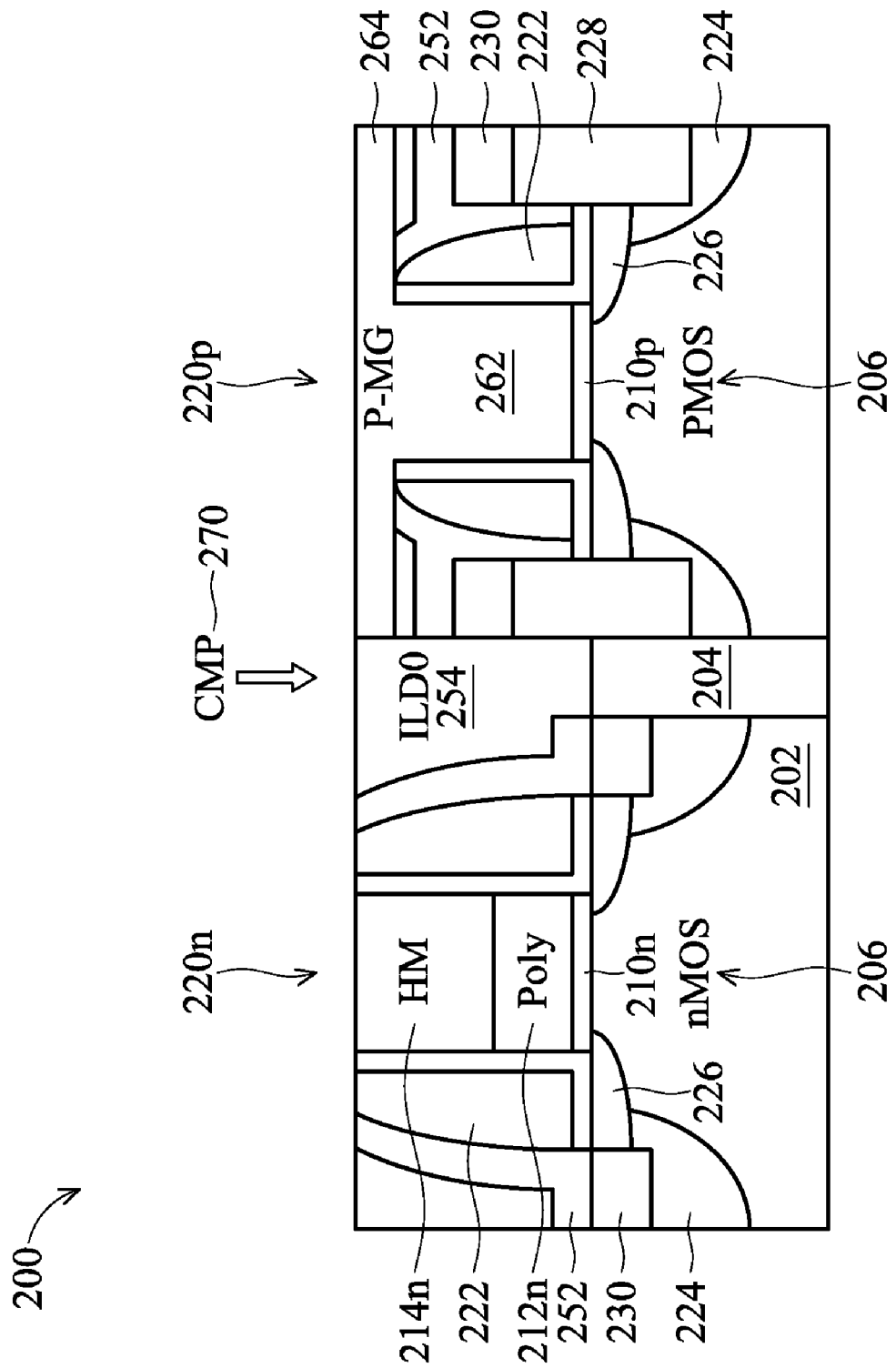

The method 100 continues with block 118 in which a second CMP process is performed on the first metal layer to expose the remaining portion of the first hard mask layer in the first gate structure. In FIG. 2H, a CMP process 270 is performed to planarize the semiconductor device 200 and expose the hard mask layer 214n in the gate structure 220n. The CMP process 270 removes a portion the metal layer 264 and stops at a top surface of the hard mask layer 214n. It should be noted that some of the metal layer 264 still remains outside of the trench 262.

Figure 2I:
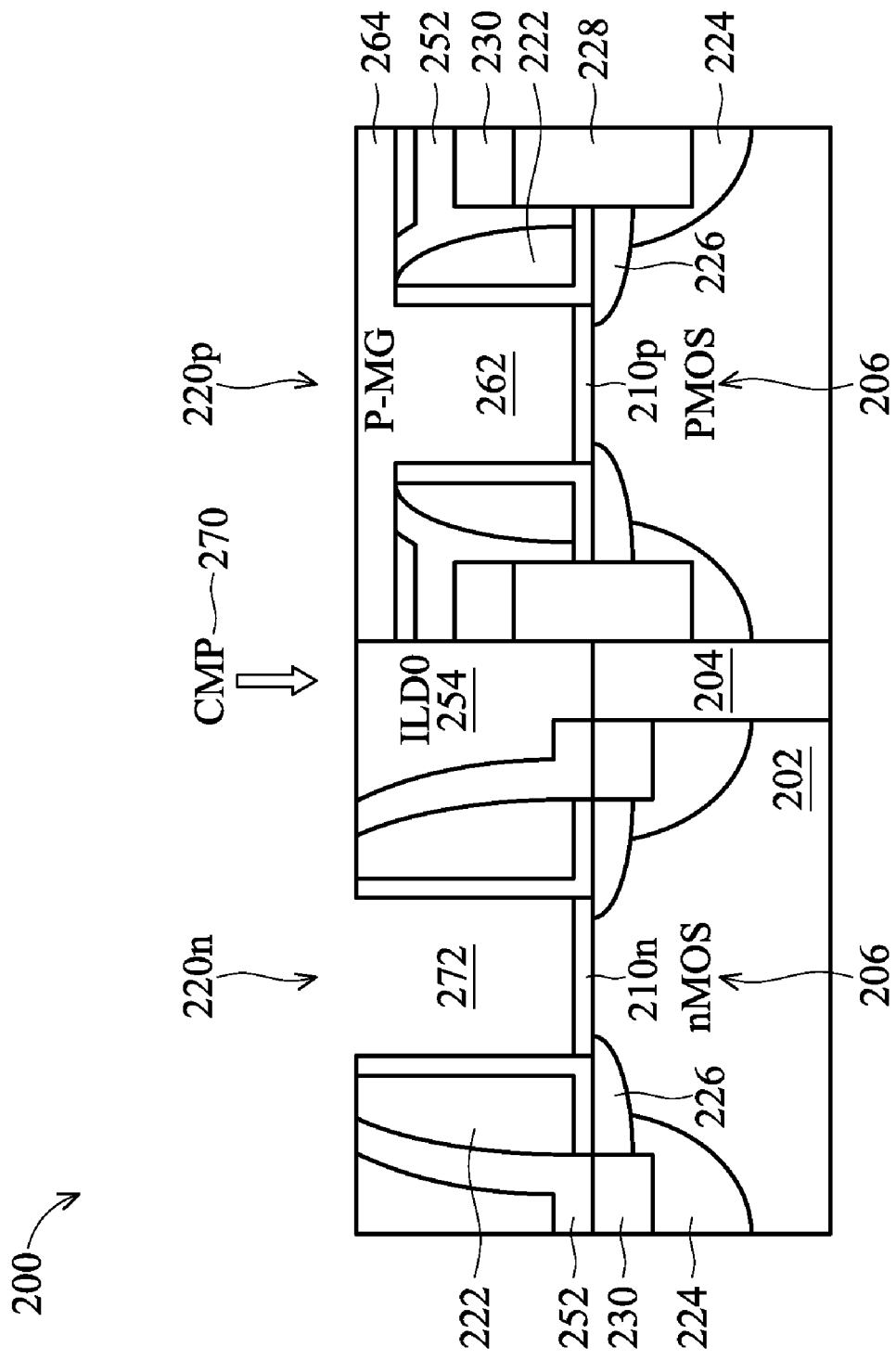

The method 100 continues with block 120 in which the remaining portion of the first hard mask layer and silicon layer are removed from the first gate structure thereby forming a second trench. In FIG. 2I, the hard mask layer 214n and the dummy poly layer 212n are removed from the gate structure 220n by a dry or wet or combination dry and wet etch process. For example, the hard mask layer 214n is removed by a wet etch dip that selectively removes the hard mask layer without removing the polysilicon. The dummy poly layer 212n is then be removed by a similar process discussed above for removing the dummy poly gate 212p in the pMOS device 208. Alternatively, the hard mask layer 214n and dummy poly layer 212n may optionally be removed in the same etch process. The selective removal of the hard mask layer 214n and dummy poly layer 212n provides a trench 272 within which a metal gate may be formed.

Figure 2J:
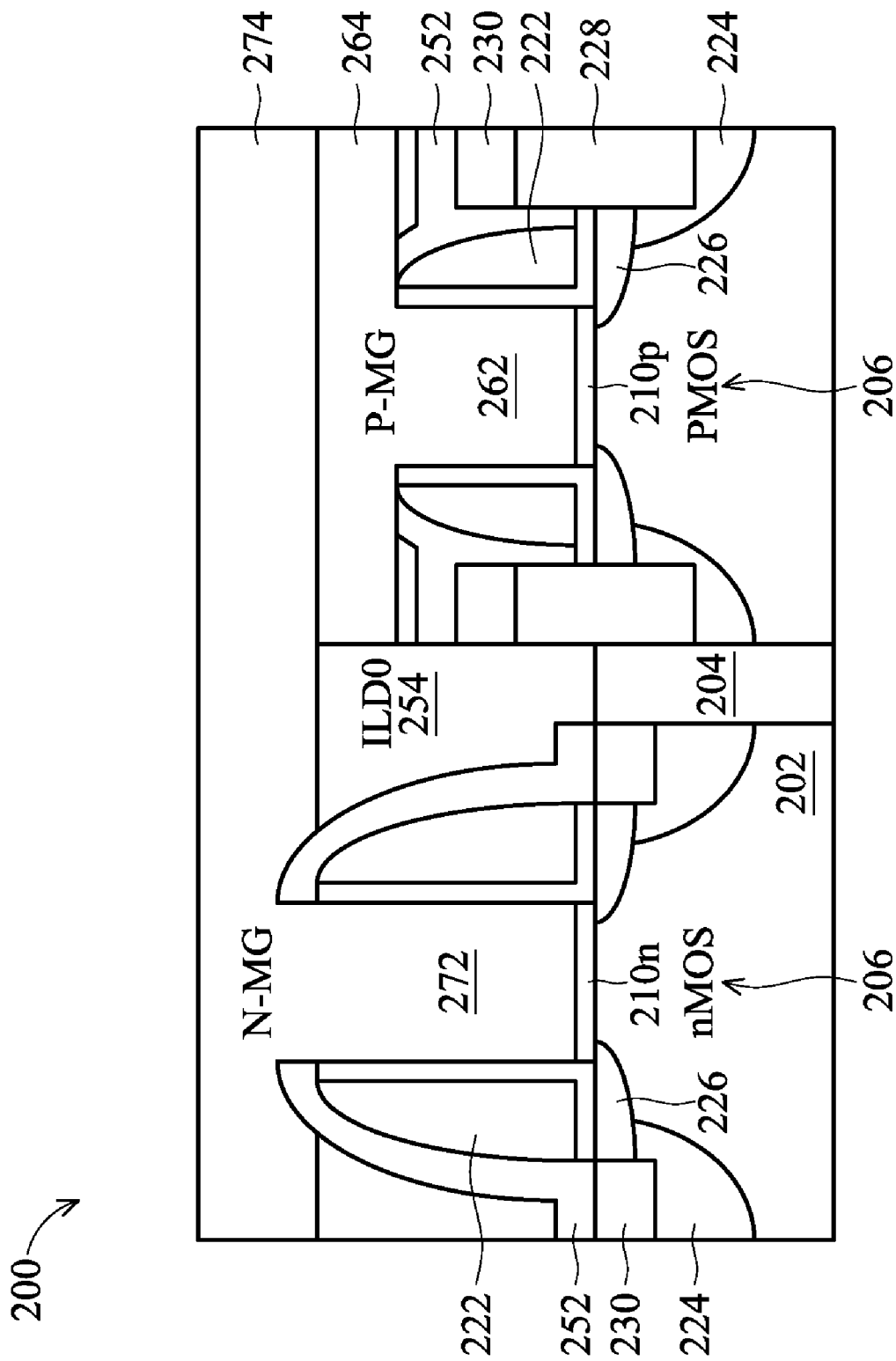

The method 100 continues with block 122 in which a second metal layer is formed to fill the second trench. In FIG. 2J, a metal layer 274 is deposited to fill in the trench 272. The metal layer 274 includes any metal material suitable for forming a metal gate or portion thereof, including work function layers, liner layers, interface layers, seed layers, adhesion layers, barrier layers, etc. The metal layer 274 may be formed by PVD or other suitable processes. The metal layer may include a N-type work function metal (N-metal) to provide a gate electrode that properly performs in the nMOS device 206. N-type metal materials may include compositions such as TiAl, TAlN, other aluminides, and/or other suitable materials. The metal layer 274 may further include a fill metal layer formed on the work function metal layer. The fill metal layer may include aluminum (Al) or tungsten (W), or other suitable materials. In an embodiment, the fill metal may include a Ti layer that functions as a wetting layer and an Al layer to fill in the remainder of the trench 272. The fill metal layer may be deposited using CVD, PVD, plating, or other suitable process.

Figure 2K:
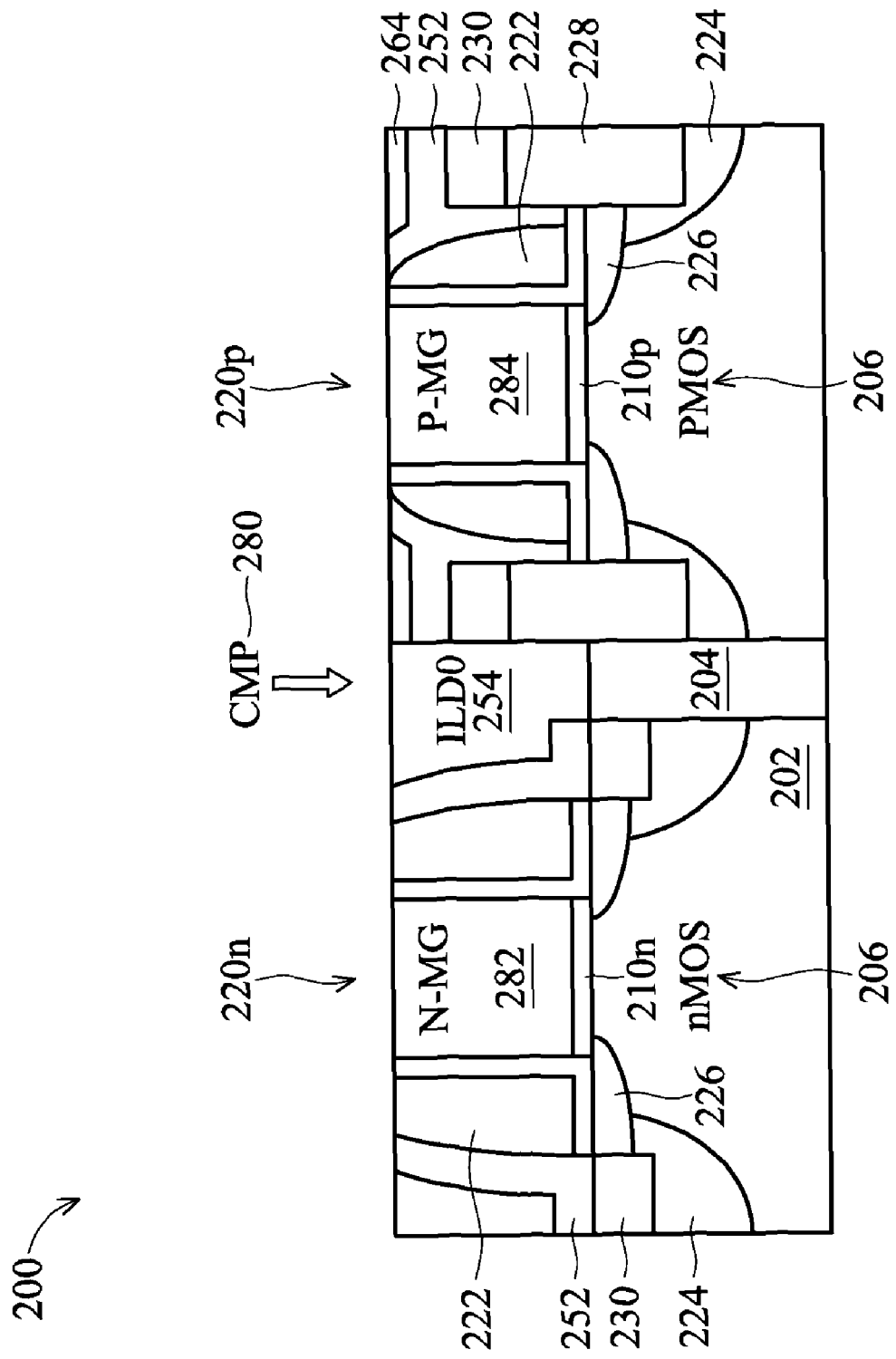

The method 100 continues with block 124 in which a third CMP process is performed to planarize the semiconductor device. In FIG. 2K, a CMP process 280 is performed to planarize the semiconductor device 200. The CMP process 280 may stop when reaching the dielectric layer 254 in both regions of the substrate 202. Accordingly, the CMP process 280 removes the remaining portion of the metal layer 264 outside of the trench 262. Also, the CMP process 280 removes the metal layer 274 form outside of the trench 272 and a portion of the gate structure in the nMOS device 206 side due to the height difference between the gate structures 220n and 220p. Thus, the CMP process 280 provides the semiconductor device 200 with an N-metal gate (N-MG) structure 282 for the nMOS device 206 and a P-metal gate structure 284 for the pMOS device 208.

In embodiments, the method 100 may continue to include additional process steps such as deposition of passivation layers, formation of contacts, interconnect structures (e.g., lines and vias, metal layers, and inter-metal dielectric that provide electrical interconnection to the device including the formed metal gate). For example, a multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure.

In summary, a gate last process may be implemented to form metal gate structures. Problems with forming the metal gate structures for an nMOS and pMOS device in a gate last process may be addressed by providing different hard mask layer thicknesses. For example, controlling the poly gate height is challenging due to a loading effect of the nMOS and pMOS devices. Accordingly, the polysilicon layer is partially removed in a region of one type of device (e.g., nMOS or pMOS) prior to gate pattering/etching. Accordingly, a subsequent hard mask layer formed on the polysilicon layer will have a different thickness in the nMOS device side as compared to the thickness in the pMOS device side. Thus, the poly gate height can be better controlled when performing CMP in the gate last process and N/P patterning is simplified. Further, the methods and devices disclosed herein may easily be integrated with current CMOS process flow and semiconductor processing equipment, and may provide a good process window to control the poly gate height. It is understood that different embodiments offer several different advantages, and that no particular advantage is necessarily required for all embodiments.

While the preceding description shows and describes one or more embodiments, it will be understood by those skilled in the art that various changes in form and detail may be made therein without departing from the spirit and scope of the present disclosure. For example, although the methods implements a "gate last" approach, the methods disclosed herein may be used in a hybrid process in which one type of metal gate is formed in a "gate first" process and the other type of metal gate is formed in a "gate last" process. Further, although a photoresist material is disclosed herein to protect the bottom metal in the trench, it has been contemplated that other polymeric materials may be used since an exposure process is not required for the etch back process. Moreover, although the embodiments disclosed herein show that the P-metal gate is formed and then the N-metal gate is formed thereafter, it is understood the N-metal gate may be formed and the P-metal gate is formed thereafter. Therefore, the claims should be interpreted in a broad manner, consistent with the present disclosure.

What is claimed is:

1. A method of fabricating a semiconductor device, comprising:
   providing a semiconductor substrate having a first region and a second region;
   forming a first gate structure in the first region and a second gate structure in the second region, the first gate structure including a first hard mask layer that has a first thickness and the second gate structure including a second hard mask layer that has a second thickness less than the first thickness;
   removing the first and second hard mask layer from the first and second gate structure, respectively, wherein a portion of the first hard mask layer remains in the first gate structure and all of the second hard mask layer is removed from the second gate structure;
   forming an inter-layer dielectric (ILD);
   performing a first chemical mechanical polishing (CMP) to expose a silicon layer in the second gate structure;
   removing the silicon layer from the second gate structure thereby forming a first trench, wherein the remaining portion of the first hard mask layer protects a silicon layer in the first gate structure from being removed;
   forming a first metal layer to fill the first trench;
   performing a second CMP to expose the remaining portion of the first hard mask layer in the first gate structure;
   removing the remaining portion of the first hard mask layer and the silicon layer from the first gate structure thereby forming a second trench;
   forming a second metal layer to fill the second trench; and
   performing a third CMP to planarize the semiconductor device.

2. The method of claim 1, wherein removing the second hard mask layer includes performing an etch back process.

3. The method of claim 2, wherein the remaining portion of the first hard mask includes a thickness ranging from about 200 to about 600 angstroms.

4. The method of claim 1, wherein forming the first and second gate structures includes:
   forming a high-k dielectric layer over the substrate;
   forming a silicon layer over the high-k dielectric layer;
   partially etching the silicon layer in the first region;
   forming a hard mask layer over the silicon layer; and
   pattering the high-k dielectric layer, silicon layer, and hard mask layer to form the first and second gate structures, respectively.

5. The method of claim 1, wherein performing the third CMP includes forming a first metal gate of the second metal layer in the first gate structure and a second metal gate of the first metal layer in the second gate structure.

6. The method of claim 5, wherein a top surface of the first metal gate and a top surface of the second metal gate are substantially co-planar.

7. The method of claim 1, wherein the first metal layer includes a P-work function metal layer and wherein the second metal layer includes an N-work function metal layer.

8. The method of claim 7, wherein the first gate structure is part of a nMOS device and wherein the second gate structure is part of a pMOS device.

9. The method of claim 1, wherein the first metal layer includes an N-work function metal layer and wherein the second metal layer includes an P-work function metal layer.

10. The method of claim 9, wherein the first gate structure is part of a pMOS device and wherein the second gate structure is part of a nMOS device.

11. A method of fabricating a semiconductor device, comprising:
   providing a semiconductor substrate having a first region and a second region;
   forming first and second gate structures over the first and second regions, respectively, the first gate structure including a first protection layer having a first thickness and a first dummy layer, the second gate structure including a second protection layer having a second thickness less than the first thickness and a second dummy layer;
   removing the second protection layer from the second gate structure and a portion of the first protection layer from the first gate structure;
   forming an inter-layer dielectric (ILD);
   exposing the second dummy layer;
   removing the second dummy layer from the second gate structure thereby forming a first trench;
   forming a first metal layer in the first trench;
   exposing a remaining portion of the first protection layer in the first gate structure;
   removing the remaining portion of the first protection layer and the first dummy layer from the first gate structure thereby forming a second trench; and
   forming a second metal layer in the second trench.

12. The method of claim 11, wherein removing the second protection layer and a portion of the first protection layer includes performing an etch back process.

13. The method of claim 11, wherein forming first and second gate structures includes:
   forming an interfacial layer over the substrate;
   forming a high-k dielectric layer over the interfacial layer;
   forming a barrier layer over the high-k dielectric layer;
   forming a polysilicon layer over the barrier layer;
   partially etching the polysilicon layer;
   forming the protection layer over the partially etched polysilicon layer; and
   pattering the interfacial layer, high-k dielectric layer, barrier layer, partially etched polysilicon layer, and protection layer to form the first and second gate structures, respectively;
   wherein the partially etch polysilicon layer is patterned to form, the first and second dummy layers in the first and second gate structures, respectively.

14. The method of claim 11, wherein the remaining portion of the first protection layer includes a thickness ranging from about 200 to about 600 angstroms.

15. The method of claim 11, wherein the first metal layer includes a P-work function metal and wherein the second metal layer includes an N-work function metal.

16. The method of claim 11, wherein the first metal layer includes an N-work function metal and wherein the second metal layer includes a P-work function metal.

17. A method for fabricating a semiconductor device, comprising:
providing a semiconductor substrate having a first region and a second region;
forming a high-k dielectric layer over the semiconductor substrate;
forming a polysilicon layer over the high-k dielectric layer;
partially etching the polysilicon layer;
forming a hard mask layer over the partially etched polysilicon layer, the hard mask layer overlying the first region having a first thickness and the hard mask layer overlying the second region having a second thickness less than the first thickness;
pattering the high-k dielectric layer, the partially etched polysilicon layer, and the hard mask layer to form first and second gate structures over the first region and second region, respectively;
removing the hard mask layer from the second gate structure and a portion of the hard mask layer from the first gate structure;
forming an inter-layer dielectric (ILD);
performing a first chemical mechanical polishing (CMP) to expose the polysilicon layer in the second gate structure;
remove the polysilicon layer from the second gate structure thereby forming a first trench;
forming a first metal layer to fill the first trench;
performing a second CMP to expose a remaining portion of the hard mask layer in the first gate structure;
remove the remaining portion of the hard mask layer and the polysilicon layer from the first gate structure thereby forming a second trench;
forming a second metal layer to fill the second trench; and
performing a third CMP to planarize the semiconductor device.

18. The method of claim 17, wherein removing the hard mask layer from the second gate structure and a portion of the hard mask layer from the first gate structure includes:
spin-coating a photoresist layer over the semiconductor substrate; and
performing an etch-back process that substantially stops at the polysilicon layer in the second gate structure.

19. The method of claim 17, wherein partially etching the polysilicon layer includes:
forming a patterned photoresist layer to protect the polysilicon layer overlying the second region; and
etching a portion of the unprotected polysilicon layer overlying the first region.

20. The method of claim 17, wherein the first metal layer includes a P-work function metal and wherein the second metal layer includes an N-work function metal.

* * * * *